United States Patent
Fujita et al.

(10) Patent No.: US 11,385,293 B2
(45) Date of Patent: Jul. 12, 2022

(54) BATTERY STATE ESTIMATING APPARATUS, BATTERY STATE ESTIMATING METHOD, NON-TRANSITORY COMPUTER READABLE MEDIUM, CONTROL CIRCUIT AND POWER STORAGE SYSTEM

(71) Applicant: KABUSHIKI KAISHA TOSHIBA, Minato-ku (JP)

(72) Inventors: Yumi Fujita, Chuo (JP); Tomokazu Morita, Funabashi (JP); Nobukatsu Sugiyama, Kawasaki (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 127 days.

(21) Appl. No.: 16/801,264

(22) Filed: Feb. 26, 2020

(65) Prior Publication Data
US 2020/0191875 A1    Jun. 18, 2020

Related U.S. Application Data

(63) Continuation of application No. PCT/JP2019/007147, filed on Feb. 25, 2019.

(30) Foreign Application Priority Data

Sep. 12, 2018   (JP) .............................. JP2018-170750

(51) Int. Cl.
*G01R 31/00*      (2006.01)
*G01R 31/3842*    (2019.01)
(Continued)

(52) U.S. Cl.
CPC ....... *G01R 31/3842* (2019.01); *G01R 31/367* (2019.01); *G01R 31/3648* (2013.01);
(Continued)

(58) Field of Classification Search
USPC .................................................. 324/426, 433
See application file for complete search history.

(56) References Cited

U.S. PATENT DOCUMENTS 8,489,264 B2   7/2013  Morita et al.
9,213,070 B2   12/2015 Hoshino et al.
(Continued)

FOREIGN PATENT DOCUMENTS

JP   2010-236925 A   10/2010
JP   2012-251806 A   12/2012
(Continued)

OTHER PUBLICATIONS

International Search Report dated Apr. 11, 2019 in PCT/JP2019/007147 filed on Feb. 25, 2019, 4 pages.
(Continued)

*Primary Examiner* — Vincent Q Nguyen
(74) *Attorney, Agent, or Firm* — Oblon, McClelland, Maier & Neustadt, L.L.P.

(57) ABSTRACT

A battery state estimating apparatus as an embodiment of the present invention includes a state estimator, a power estimator, and a determiner. The state estimator estimates a state of a battery. The power estimator estimates first power amount charged/discharged by the battery within a charging/discharging period, based on the state. The determiner compares the first power amount with second power amount inputted/outputted to/from the battery within the charging/discharging period and thereby determines validity of the state.

10 Claims, 6 Drawing Sheets

(51) Int. Cl.
*G01R 31/388* (2019.01)
*G01R 31/367* (2019.01)
*G01R 31/36* (2020.01)
*H01M 10/0525* (2010.01)
*H01M 10/48* (2006.01)

(52) U.S. Cl.
CPC ...... *G01R 31/388* (2019.01); *H01M 10/0525* (2013.01); *H01M 10/482* (2013.01)

(56) References Cited

U.S. PATENT DOCUMENTS

| | | | |
|---|---|---|---|
| 10,274,545 B2 | 4/2019 | Sugiyama et al. | |
| 10,338,144 B2 | 7/2019 | Sugiyama et al. | |
| 2010/0204861 A1* | 8/2010 | Kaita | H02J 7/0088 701/22 |
| 2014/0222358 A1 | 8/2014 | Morita et al. | |
| 2015/0160300 A1 | 6/2015 | Ishii et al. | |
| 2015/0301115 A1 | 10/2015 | Ohkawa et al. | |
| 2016/0011274 A1 | 1/2016 | Morita et al. | |
| 2016/0380313 A1 | 12/2016 | Morita et al. | |
| 2017/0242079 A1 | 8/2017 | Duan et al. | |
| 2017/0263984 A1 | 9/2017 | Fujita et al. | |
| 2018/0006335 A1 | 1/2018 | Fujita et al. | |
| 2018/0076633 A1* | 3/2018 | Fujita | H01M 10/425 |

FOREIGN PATENT DOCUMENTS

| | | |
|---|---|---|
| JP | 2014-149280 A | 8/2014 |
| JP | 2014-190763 A | 10/2014 |
| JP | 2015-111086 A | 6/2015 |
| JP | 2015-175753 A | 10/2015 |
| JP | 2015-178963 A | 10/2015 |
| JP | WO2017/046870 A1 | 3/2017 |
| JP | 2017-166874 A | 9/2017 |
| JP | 2018-046667 A | 3/2018 |
| JP | 2019-35679 A | 3/2019 |
| WO | WO 2016/038658 A1 | 3/2016 |
| WO | WO 2017/046870 A1 | 3/2017 |

OTHER PUBLICATIONS

Written Opinion dated Apr. 11, 2019 in PCT/JP2019/007147 filed on Feb. 25, 2019, 6 pages.

* cited by examiner

BATTERY STATE ESTIMATING APPARATUS, BATTERY STATE ESTIMATING METHOD, NON-TRANSITORY COMPUTER READABLE MEDIUM, CONTROL CIRCUIT AND POWER STORAGE SYSTEM

CROSS-REFERENCE TO RELATED APPLICATION(S)

This application is a Continuation of International Application No. PCT/JP 2019/007147 filed on Feb. 25, 2019, the entire contents of which are hereby incorporated by reference.

FIELD

An embodiment relates to a battery state estimating apparatus, a battery state estimating method, a program, a control circuit and a power storage system.

BACKGROUND

Nonaqueous electrolyte secondary batteries such as lithium ion batteries are widely used for electronic equipment such as smart phones. However, it is known that these secondary batteries deteriorate rapidly, causing swelling, smoking, igniting, and the like of battery packs. To avoid these problems, it is essential to estimate a state of the secondary batteries and perform control according to the estimated state. However, depending on an environment and the like in estimating, errors can occur in estimation results. Therefore, it is necessary to check validity before performing control based on the estimation results.

DETAILED DESCRIPTION

To recognize whether there is any error in estimation results, as an embodiment of the present invention, we provide an apparatus that determines validity of the estimation results.

A battery state estimating apparatus as an embodiment of the present invention includes a state estimator, a power estimator, and a determiner. The state estimator estimates a state of a battery. The power estimator estimates first power amount charged/discharged by the battery within a charging/discharging period, based on the state. The determiner compares the first power amount with second power amount inputted/outputted to/from the battery within the charging/discharging period and thereby determines validity of the state.

An embodiment will be explained in detail below with reference to the accompanying drawings. The present invention is not limited to the embodiment.

An Embodiment of the Present Invention

Figure 1:
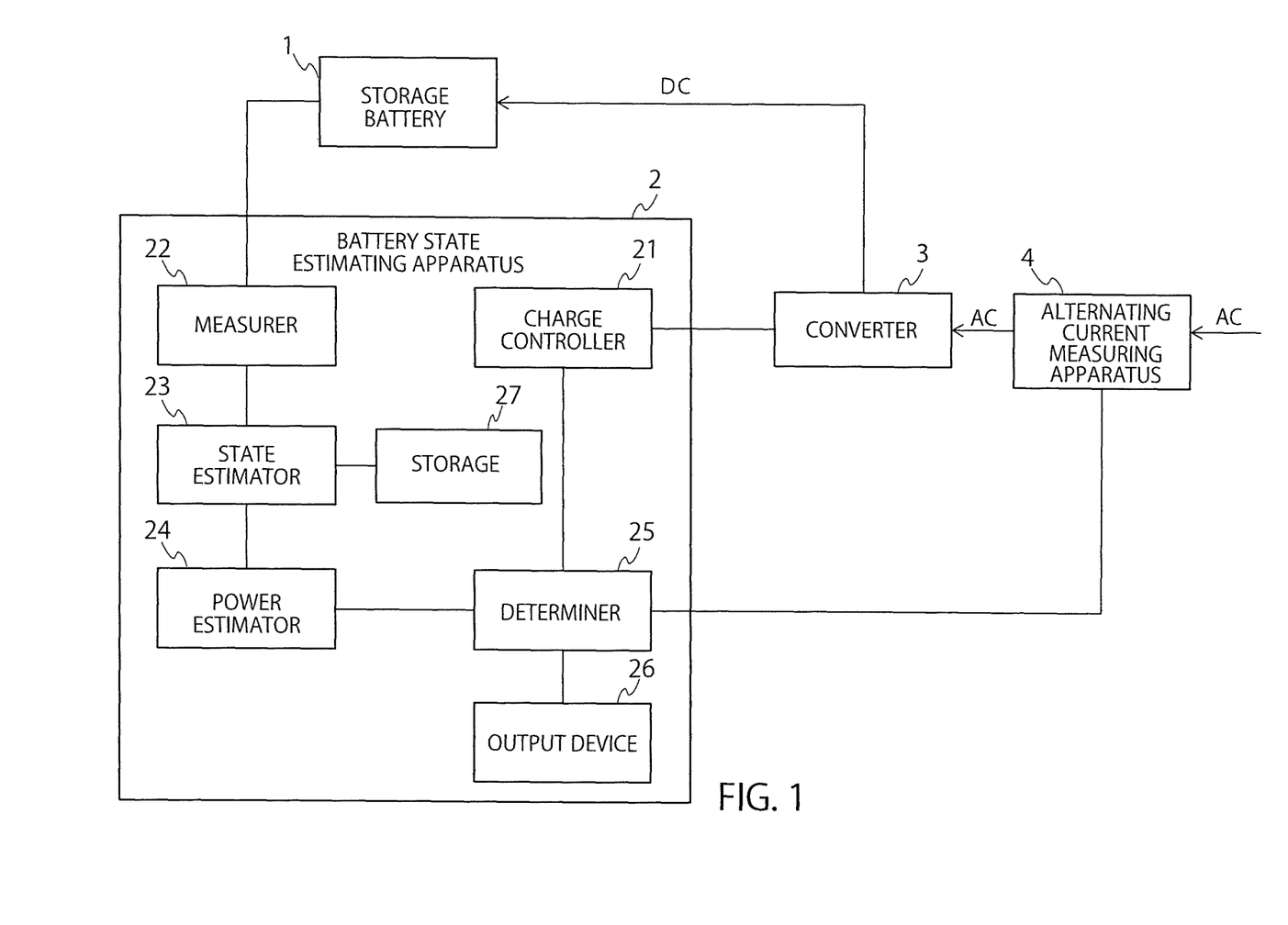
FIG. 1 is a block diagram illustrating an example of a schematic configuration of a power storage system including a battery state estimating apparatus according to an embodiment of the present invention.

FIG. 1 is a block diagram illustrating an example of a schematic configuration of a power storage system including a battery state estimating apparatus according to an embodiment of the present invention. The power storage system includes a storage battery 1, the battery state estimating apparatus 2, a converter 3, and an alternating current measuring apparatus 4. The battery state estimating apparatus 2 includes a charge controller 21, a measurer 22, a state estimator 23, a power estimator 24, a determiner 25, an output device 26, and a storage 27.

The storage battery 1 is a secondary battery whose state is estimated by the battery state estimating apparatus 2. The storage battery 1 is assumed to be a nonaqueous electrolyte secondary battery such as a lithium ion battery, a battery pack of the nonaqueous electrolyte secondary batteries, or the like. However, the storage battery 1 is not limited to these batteries, and may be any rechargeable battery. Hereinafter, the term "storage battery" includes a battery pack, battery module, and unit cell unless otherwise noted.

The storage battery 1 may be installed, for example, in equipment such as a cell phone, laptop PC, electric bicycle, hybrid vehicle that uses both electricity and gasoline, or drone. Also, the storage battery 1 may be a stationary storage battery installed for each structure such as a private house, building, or factory. The storage battery 1 may be linked with or interconnected with a power generation system.

The battery state estimating apparatus 2 estimates a state of the storage battery 1. It is assumed that the state to be estimated is not readily detected by a sensor or the like provided outside the storage battery 1. For example, it is conceivable to estimate mass or SOC (State of Charge) of a positive/negative terminal inside the storage battery 1. The estimated value may be used, as it is, as the state of the storage battery 1. Alternatively, the state of the storage battery 1 may be estimated based on the estimated value. For example, the state of the storage battery 1 may be estimated to be "normal" when the mass of the positive terminal of the storage battery 1 falls within a predetermined range. It may be estimated to be "abnormal" when the mass of the positive terminal falls outside the predetermined range.

Incidentally, in the present embodiment, the storage battery 1 and battery state estimating apparatus 2 have been described as being separate. However, it is possible to construct a storage battery 1 equipped with the battery state estimating (a storage device) by installing the battery state estimating apparatus 2 implemented by a control circuit or the like in the storage battery 1.

The converter 3 converts an alternating current (AC) to a direct current (DC) or vice versa. Arrows in FIG. 1 indicate that an alternating current from the alternating current measuring apparatus 4 is converted to a direct current, which then flows to the storage battery 1. In this way, the storage battery 1 is charged with the direct current from the converter 3. Incidentally, a direct current discharged from the storage battery 1 may be converted to an alternating current by the converter 3.

For example, in a power storage system equipped with a stationary storage battery, a PCS (Power Conditioning Subsystem) corresponds to the converter 3. Also, when the storage battery 1 is contained in a laptop PC, an AC adaptor corresponds to the converter 3.

The alternating current measuring apparatus 4 performs measurements on an alternating current inputted/outputted to/from the converter 3. The measurements are assumed to be performed to know the power amount of the alternating current in a fixed period of time, but measurements may be performed to get time series data of power of the alternating current or to get time series data of the alternating current and voltage. Measurement data (second measurement data) on the alternating currents is sent to the battery state estimating apparatus 2. It is assumed that the alternating current measuring apparatus 4 is installed, for example, between an AC power supply and the PCS. The alternating current measuring apparatus 4 may be a commonly used measuring apparatus. Incidentally, the phrase "input/output" may mean any one or both of input and output.

In the power storage system described above, the battery state estimating apparatus 2 of the present embodiment determines validity of an estimated state. Several methods for estimating the state of a battery are known, but errors may occur in estimation results depending on the environment and the like of estimation. For example, charge curve analysis (CCA), which allows an internal state and the like of the battery to be estimated, is known. In using the charge curve analysis, when a charging rate, temperature, the SOC at the start of charging, and the like fall outside specific ranges, errors might occur in estimation results. However, it is impracticable to verify every battery state and every charging data beforehand to improve estimation accuracy. Also, in the case of a stationary power storage system equipped with a battery, PCS, and the like, unexpected current fluctuations due to malfunctions of the PCS or the like might cause errors in estimation results. If remaining capacity of the battery is estimated erroneously due to the errors, convenience of the stationary power storage system may be impaired.

For the above reasons, the battery state estimating apparatus 2 of the present embodiment determines the validity of state estimation to prevent malfunctions caused by low-accuracy estimation. In the present embodiment, a case in which a state is estimated using charge curve analysis will be described.

The charge curve analysis makes it possible to estimate the internal state and the like of a battery based on measurement data taken in charging or discharging of the battery. Therefore, if a program is installed on equipment that uses the storage battery 1, the device can be used as the battery state estimating apparatus 2 and can estimate the state of the storage battery 1 in use based on measurement data on the storage battery 1 in use. Even if the state of the storage battery 1 is detected by inspecting the storage battery 1 before use, the state of the storage battery 1 changes with use. Therefore, malfunctions might occur by a controlling based on the state detected by inspection before use. Thus, it is preferable to estimate the state of the storage battery 1 in use.

Incidentally, charging of the storage battery 1 will be described for convenience of explanation, but the charge curve analysis allows state estimation to be made during discharging as well. Therefore, the term "charge" may be interchanged with "discharge" or "charge/discharge" unless otherwise noted. The phrase "charge/discharge" may mean either charge or discharge or mean both charge and discharge.

Incidentally, techniques for state estimation are not limited to the charge curve analysis. Techniques other than the charge curve analysis may be used for state estimation. As the techniques, a charge-discharge test that involves measuring battery capacity by passing a test current; a current interruption method that mainly involves measuring an internal resistance value; and electrochemical measurement like AC impedance measurement may be used. Also, these techniques may be used in combination.

Figure 2:
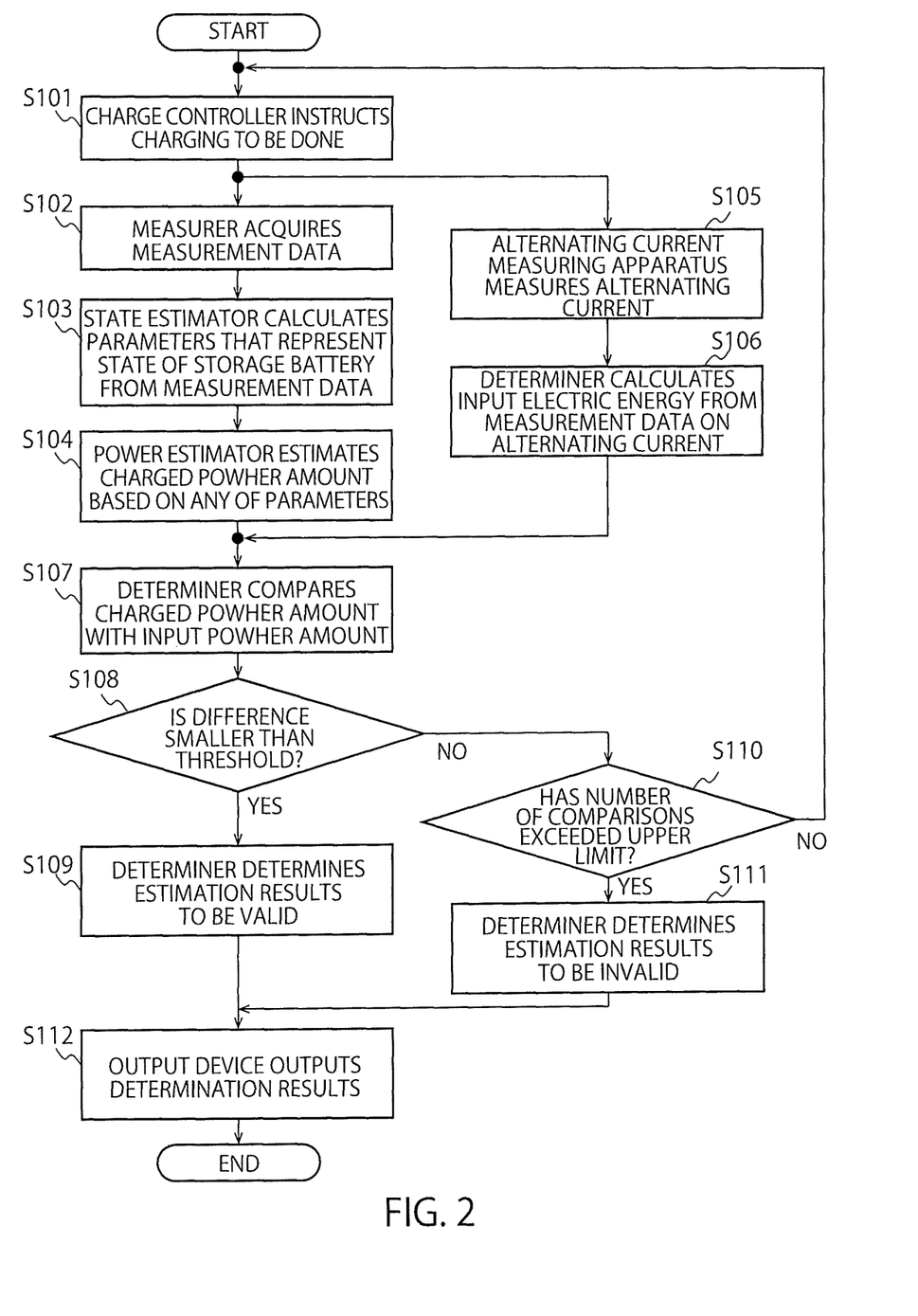
FIG. 2 is a flowchart illustrating an example of processes flow of the battery state estimating apparatus.

Two process flows of the battery state estimating apparatus 2 will be described. FIG. 2 is a flowchart illustrating an example of processes flow of the battery state estimating apparatus. It is assumed here that battery state estimation and validity determination are made as a sequence of processes.

This flowchart is an example and that the order and the like of processes are not limited as long as necessary process results can be obtained. Also, process results may be stored sequentially in the storage 27, and each component may acquire the process results by referring to the storage 27. This is also true for subsequent flowcharts.

The charge controller 21 instructs the storage battery 1 to get charged (S101). In response, the storage battery 1 is charged with a direct current from the converter 3. The measurer 22 generates measurement data (first measurement data) that represents at least voltage and current of the storage battery 1 during a period in which the storage battery 1 is charged (charging period) (S102).

The state estimator 23 calculates one or more parameters that represent the state of the storage battery 1 from the measurement data (S103). The parameters include an internal state parameter and battery characteristics. The internal state parameter and battery characteristics will be described later. The state estimator 23 selects one or more of the parameters as estimation results of the battery state estimating apparatus 2. All the parameters may be selected as the estimation results of the battery state estimating apparatus 2. Also, based on the selected parameters, the state estimator 23 may estimate the storage battery 1 to be "normal," "abnormal," or the like. Then, based on any of the parameters selected as a result of the estimation, the power estimator 24 estimates charged power amount (S104). Incidentally, the parameters selected as estimation results of the battery state estimating apparatus 2 are not necessarily used for estimation of the charged power amount.

On the other hand, the alternating current measuring apparatus 4 measures an alternating current inputted/outputted to/from the converter 3 (S105). Incidentally, the alternating current measuring apparatus 4 may constantly take measurements. Alternatively, by receiving notices of a start and an end of charging from the charge controller 21, converter 3, or the like, the alternating current measuring apparatus 4 may take measurements only during charging periods. The measurement data on the alternating current is sent to the determiner 25, and then used by the determiner to calculate power amount inputted (input power amount) into the storage battery 1 (S106).

The determiner 25 compares the charged power amount and input power amount in the same period with each other (S107). The validity is determined based on the comparison. When a difference between the charged power amount and the input power amount is smaller than a threshold (YES in S108), the determiner 25 determines that the estimation results are "valid" (S109). On the other hand, when the difference is equal to or larger than the threshold (NO in S108), it is checked whether the number of comparisons has exceeded an upper limit. When the upper limit has been exceeded (YES in S110), the determiner 25 determines that the estimation results are "invalid" (S111). In the present flowchart, the estimation is redone when the upper limit is not exceeded (YES in S110). Hence, the flow returns to a process (S101) in which the charge controller 21 instructs charging in order to redo of the estimation. After the determination (after S109 and S111), the output device 26 outputs estimation results of the battery state estimating apparatus and validity determination results (S112).

Incidentally, when the difference is equal to or larger than the threshold, the estimation results may be determined to be "invalid" regardless of whether the number of comparisons exceeds the upper limit. Also, when the number of comparisons exceeds the upper limit, the determiner 25 may determine that a malfunction has occurred and the output device 26 may output a message requesting inspection of the power storage system.

Next, components of the battery state estimating apparatus 2 and detailed processes of the components will be described.

The charge controller 21 controls charging of the storage battery 1. For example, the charge controller 21 may instruct the converter 3 to convert electric current, thereby causing charging to be done. The storage battery 1 can be charged using, for example, a typical method such as constant-current constant-voltage charging.

Also, when instructed by the determiner 25 that has determined to do recharging, the charge controller 21 may perform control such that charging will be done.

The measurer 22 takes measurements on the storage battery 1 being charged and generates measurement data representing information about the storage battery 1 being charged. As the information, at least voltage and current of the storage battery 1 during the charging period are contained in the measurement data. More specifically, a voltage between a positive electrode terminal and negative electrode terminal of each unit cell in the storage battery 1 and a current flowing through the unit cell are contained in the measurement data. Besides, temperatures and the like of the storage battery 1 and its surroundings may be contained in the measurement data.

Based on the measurement data, the state estimator 23 estimates the state of the storage battery 1. Here, the state estimator 23 calculates the internal state parameter that represents the state of each unit cell and battery characteristics (cell characteristics) using the charge curve analysis. The internal state parameter is estimated based on the measurement data. The battery characteristics are estimated based on the estimated internal state parameter.

Also, the state estimator 23 selects one or more of plural parameters calculated as the internal state parameter or battery characteristics, and determines the estimation results of the battery state estimating apparatus 2 based on the selected parameter(s).

The internal state parameter represents the internal state of the unit cell. It is assumed that the internal state parameter includes positive electrode capacity (mass of a positive electrode), negative electrode capacity (mass of a negative electrode), an SOC deviation, and internal resistance. The SOC deviation means a difference between an initial charge amount of the positive electrode and an initial charge amount of the negative electrode. The initial charge amount means a charge amount at the start of charging.

The battery characteristic can be calculated from the internal state parameters, and indicates a characteristic of a voltage or the like of the storage battery 1. The battery characteristic includes a battery capacity, an open circuit voltage (OCV), OCV curve or the like. The internal resistance may also be included in the battery characteristic. The OCV curve means a graph (function) indicating a relationship between a certain index relating to the storage battery 1 and an open circuit voltage.

The determination as to which of the internal state parameters and battery characteristics to use in estimating the state of the storage battery 1 can be made as appropriate. However, to determine the validity of the estimation, a charge amount-OCV curve (second graph) that represents a relationship between the charge amount and open circuit voltage of the storage battery 1 is used. Since the charge amount-OCV curve is included in the battery characteristics, the state estimator 23 calculates both the internal state parameters and battery characteristics regardless of the parameters used for state estimation.

It is assumed that expressions, initial values of parameters, and the like necessary for the charge curve analysis are stored in advance in the storage 27. For example, a function and the like representing a relationship between the charge amount and potential of the positive electrode or negative electrode of the unit cell are stored in the storage 27.

Based on the measurement data, the state estimator 23 calculates internal state parameters including an amount of an active material making up the positive electrode or negative electrode of the unit cell, an initial charge amount, and the internal resistance of the unit cell. The calculation uses a function of calculating a voltage of the storage battery 1 based on the active material amount and internal resistance. First, using the function, the voltage of the storage battery 1 is calculated based on the measurement data. Then, the active material amount and internal resistance that reduce a difference between the calculated voltage of the storage battery 1 and a voltage in the measurement data are obtained through regression calculation. Incidentally, the positive electrode may be made of plural active materials but in the present embodiment, description will be given by taking as an example a secondary battery in which each of the positive electrode and negative electrode is made of one active material.

In charging a secondary battery in which each of the positive electrode and negative electrode is made of one active material, voltage (terminal voltage) "Vt" at time "t" is expressed by the following expression.

[Expression 1]

$$V_t = f_c\left(q_0^c + \frac{q_t}{M_c}\right) - f_a\left(q_0^a + \frac{q_t}{M_a}\right) + RI_t \tag{1}$$

where "$I_t$" represents a current value at time "t" and "$q_t$" represents a charge amount of the secondary battery at time "t". The term "$f_c$" represents a function indicating a relationship between a charge amount of the positive electrode and a potential, "$f_a$" represents a function indicating a relationship between a charge amount of the negative electrode and a potential. The term "$q_o^c$" represents an initial charge amount of the positive electrode and "$M_c$" represents mass of the positive electrode. The term "$q_o^a$" represents an initial charge amount of the negative electrode and "$M_a$" represents mass of the negative electrode. "R" represents internal resistance.

The electric current value "$I_t$" is indicated in the measurement data. The charge amount "$q_t$" is calculated as a time integral of the electric current value "$I_t$." The functions "$f_c$" and "$f_a$" are assumed to be stored beforehand in the storage 27.

The remaining five values (parameter set) of the initial charge amount "$q_o^c$" of the positive electrode, mass "$M_c$" of the positive electrode, the initial charge amount "$q_o^a$" of the negative electrode, the mass "$M_a$" of the negative electrode and the internal resistance "R" are estimated through regression calculation. Incidentally, the amount of active material of each electrode may be calculated assuming that it is a predetermined proportion of mass of each electrode.

Figure 3:
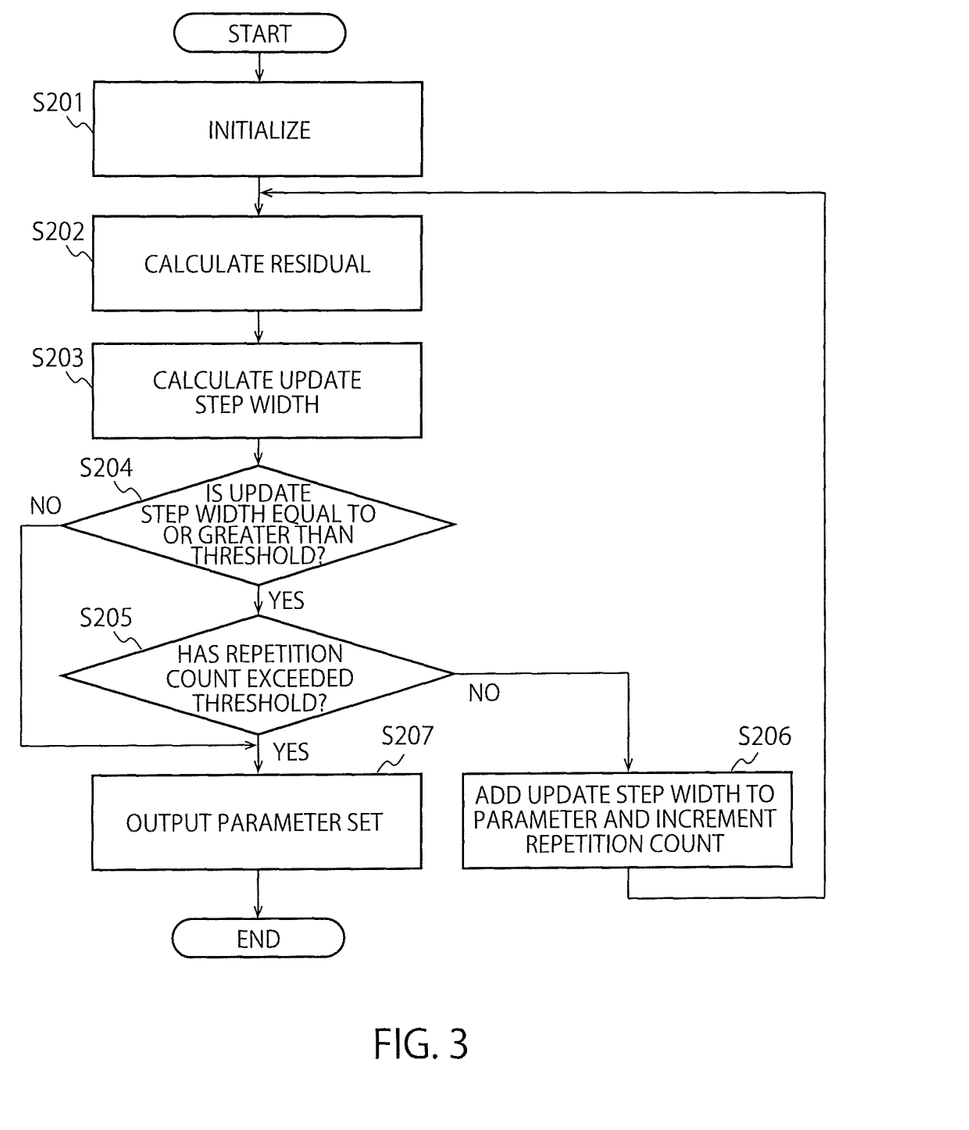
FIG. 3 is a flowchart illustrating an example of flow of calculation process for an internal state parameter.

FIG. 3 is a flowchart illustrating an example of flow of calculation process for an internal state parameter. The state estimator 23 performs initialization and thereby sets initial values of the parameter set described above and sets an repetition count of the regression calculation to zero (S201). The initial value may be, for example, a value calculated in the previous process or a conceivable initial value.

The state estimator 23 calculates a residual E expressed by the following expression (S202)

[Expression 2]

$$E = \sum_{t=0}^{t_{end}} (V_{bat\_t} - V_t)^2 \qquad (2)$$

$$= \sum_{t=0}^{t_{end}} \left(V_{bat\_t} - \left(f_c\left(q_0^c + \frac{q_t}{M_c}\right) - f_a\left(q_0^a + \frac{q_t}{M_a}\right) + RI_t\right)\right)^2$$

where "Vbat_t" represents a terminal voltage at time "t" and "tend" represents end time of charging.

The state estimator 23 calculates an update step width of the parameter set (S203). The update step width of the parameter set can be calculated by a method such as a Gauss-Newton method or Levenberg-Marquardt method, for example.

The state estimator 23 determines whether or not the scale of the update step width is less than a predetermined scale (S204). When the scale of the update step width is less than the predetermined scale (NO in S204), The state estimator 23 determines that calculation has converged and outputs the parameter set (S207). When the scale of the update step width is equal to or greater than the predetermined threshold (YES in S204), the deterioration state estimator 231 confirms whether or not a repetition count of regression calculation exceeds a predetermined value (S205).

When the repetition count of regression calculation exceeds the predetermined value (YES in S205), the deterioration state estimator 231 outputs the parameter set (S207). When the repetition count of regression calculation is equal to or below the predetermined value (NO in S205), the deterioration state estimator 231 adds the update step width calculated in S203 to the parameter set and increments by one the repetition count of regression calculation (S206). The flow then returns to the calculation of a residual (S202). In this way, the parameter set is calculated based on the measurement data.

The state estimator 23 further calculates battery characteristics from the internal state parameters. Description will be given of a method for calculating the charge amount, open circuit voltage, charge amount-OCV curve, and the like of the storage battery 1 based on the parameter set of the internal state parameters (initial charge amount "$q_o^c$" of the positive electrode, mass "$M_c$" of the positive electrode, initial charge amount "$q_o^a$" of the negative electrode, and mass "$M_a$" of the negative electrode) again.

Figure 4:
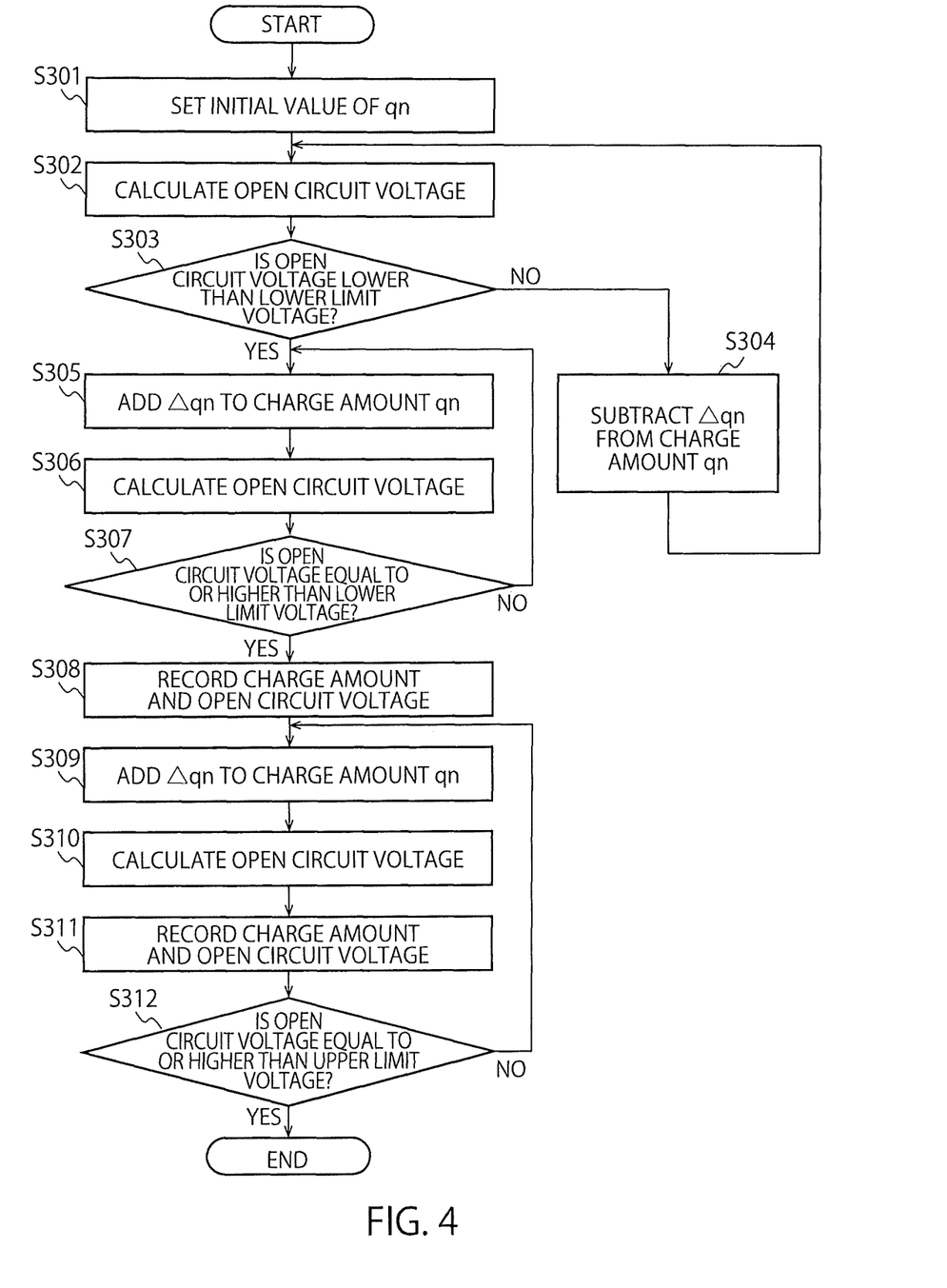
FIG. 4 is a flowchart illustrating an example of flow of a battery characteristics calculation process.

FIG. 4 is a flowchart illustrating an example of flow of a battery characteristics calculation process. The flowchart starts after calculation of the internal state parameters. In this flowchart, the charge amount "$q_n$" is increased and decreased in increments of a predetermined value "$\Delta q_n$," the charge amount "$q_{n0}$" at which the open circuit voltage exceeds the lower limit is found, then "$q_n$" is increased in increments of "$\Delta q_n$" by using "$q_{n0}$" as an initial value until the open circuit voltage exceeds the upper limit, and the charge amount and open circuit voltage are recorded at each increment. Consequently, the relationship between the charge amount and open circuit voltage in a range from the lower limit to the upper limit of the open circuit voltage can be calculated.

The state estimator 23 sets the initial value of the charge amount "$q_n$" (S301). The initial value of "$q_n$" may be set to zero or to a value smaller than zero by a few percent of nominal capacity of the storage battery 1. Specifically, if the nominal capacity of the storage battery 1 is 1000 mAh, the initial value of "$q_n$" can be set within a range of approximately −50 mAh to 0 mAh.

The state estimator 23 calculates the open circuit voltage (S302). The open circuit voltage can be calculated using the following Expression.

[Expression 3]

$$E_n = f_c\left(q_0^c + \frac{q_n}{M_c}\right) - f_a\left(q_0^a + \frac{q_n}{M_a}\right) \qquad (3)$$

Next, the state estimator 23 compares the calculated open circuit voltage with a predetermined lower limit voltage (S303). The lower limit voltage is a value determined by a combination of the positive electrode active material and negative electrode active material used in the storage battery 1. Specifically, appropriate operating voltage ranges are determined for the positive electrode active material and negative electrode active material, respectively, from the viewpoint of each of safety, life, resistance, and the like, and the lower limit and upper limit voltage of the operating range for the storage battery 1 is determined based on a combination of the ranges.

When the open circuit voltage is not lower than the predetermined lower limit voltage (NO in S303), "$\Delta q_n$" is subtracted from the charge amount "$q_n$" (S304) and the open circuit voltage is calculated again (S302). When the open circuit voltage is lower than the predetermined lower limit voltage (YES in S303), the state estimator 23 adds "$\Delta q_n$" to the charge amount "$q_n$" (S305). Consequently, the charge amount "$q_n$" approaches to the lower limit value. "$\Delta q_n$" can be set to any value. For example, it is conceivable to set "$\Delta q_n$" to approximately 1/1000 to 1/100 of the nominal capacity of the storage battery 1. Specifically, if the nominal capacity of the storage battery 1 is 1000 mAh, it is conceivable to set "$\Delta q_n$" to a range of approximately 1 mAh to 10 mAh.

The state estimator 23 calculates the open circuit voltage using the charge amount "$q_n$"+"$\Delta q_n$" resulting from the addition (S306). Then, the state estimator 23 compares the calculated open circuit voltage with the lower limit voltage described above (S307). When the open circuit voltage is lower than the lower limit voltage (NO in S307), the state estimator 23 returns to S305 and adds "$\Delta q_n$" to the charge amount "$q_n$" again (S305). When the open circuit voltage is equal to or higher than the lower limit voltage (YES in S307), because the open circuit voltage has reached or exceeded the lower limit value, the state estimator 23 sets the charge amount "$q_n$" at this time to "$q_{n0}$" and records the charge amount "$q_{n0}$" and open circuit voltage "$E_n$" together (S308). Incidentally, the value of the charge amount "$q_{n0}$" may be set to "0" by being established as a reference value. In that case, the value obtained by subtracting the value of "$q_{n0}$" from the value of the charge amount "$q_n$" is recorded in subsequent recording.

The state estimator 23 adds "$\Delta q_n$" to the charge amount "$q_n$" (S309), calculates the open circuit voltage (S310), and records the value obtained by subtracting "$q_{n0}$" from the charge amount "$q_n$" as well as the calculated open circuit voltage "$E_n$" (S311).

The state estimator 23 compares the calculated open circuit voltage with the predetermined upper limit voltage of the storage battery 1 (S312). The upper limit voltage of the storage battery 1 is a value determined by the combination of the positive electrode active material and negative electrode active material used in the storage battery 1. When the open circuit voltage is lower than the predetermined upper limit voltage (NO in S312), the state estimator 23 returns to the process of adding "$\Delta q_n$" to the charge amount "$q_n$" again (S309). When the open circuit voltage becomes equal to or higher than the predetermined upper limit voltage (YES in S312), the process is ended. The above is the flowchart illustrating the flow of the battery characteristics calculation process.

Figure 5:
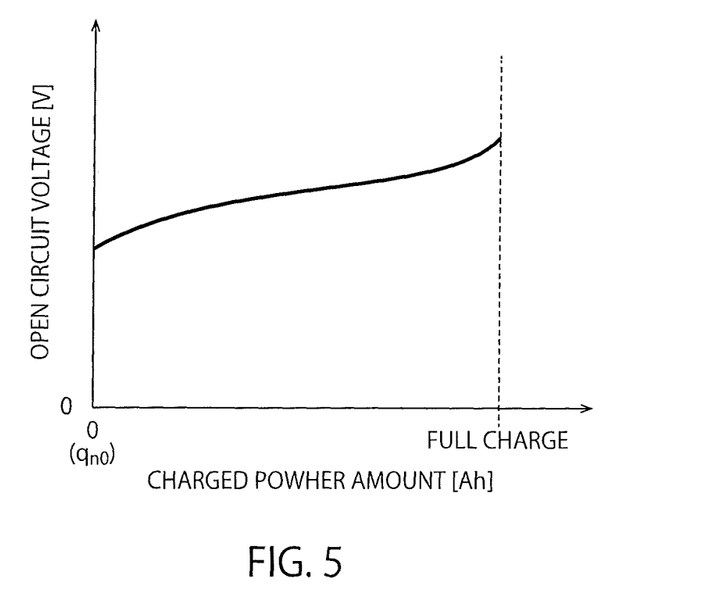
FIG. 5 is a graph illustrating an example of a relationship between a charge amount and open circuit voltage (charge amount-OCV curve)

In this way, a charge amount-OCV curve from a charge amount of "$q_{n0}$" to a full charge is calculated. FIG. 5 is a graph illustrating an example of a relationship between a charge amount and open circuit voltage (charge amount-OCV curve). The graph is created by plotting the charge amount (value obtained by subtracting "$q_{n0}$" from "$q_n$") against the open circuit voltage, where the charge amount and open circuit voltage are recorded in the process of S311 in the above flow.

Incidentally, although in the above description, the positive electrode and negative electrode of the secondary battery are each made of one kind of an active material, the present invention is similarly applicable to a secondary battery in which either or both of the positive electrode and the negative electrode of the secondary battery are made of plural kinds of active materials.

Incidentally, an estimate calculated as an internal state parameter can be used as the internal resistance, but the internal resistance changes with temperature and the like. Therefore, the state estimator 23 may correct the internal resistance. Also, using the corrected estimate, the state estimator 23 may recalculate battery characteristics calculated once.

The internal resistance can be corrected using a known technique described in Japanese Unexamined Patent Application Publication No. 2017-166874 or the like. For example, internal resistance corresponding to temperature can be calculated: by dividing the internal resistance into three components (reaction resistance "$R_{ct}$", diffusion resistance "$R_d$", and ohmic resistance "$R_{ohm}$"); by correcting the three components according to respective unique temperature dependencies; and by summing up the components.

In this way, by calculating one or more parameters that represent the state of the battery like internal state parameters and battery characteristics, the state estimator 23 estimates the state of the storage battery 1. Also, part or all of the calculated parameters are selected and used as estimation results of the battery state estimating apparatus 2.

Figure 6:
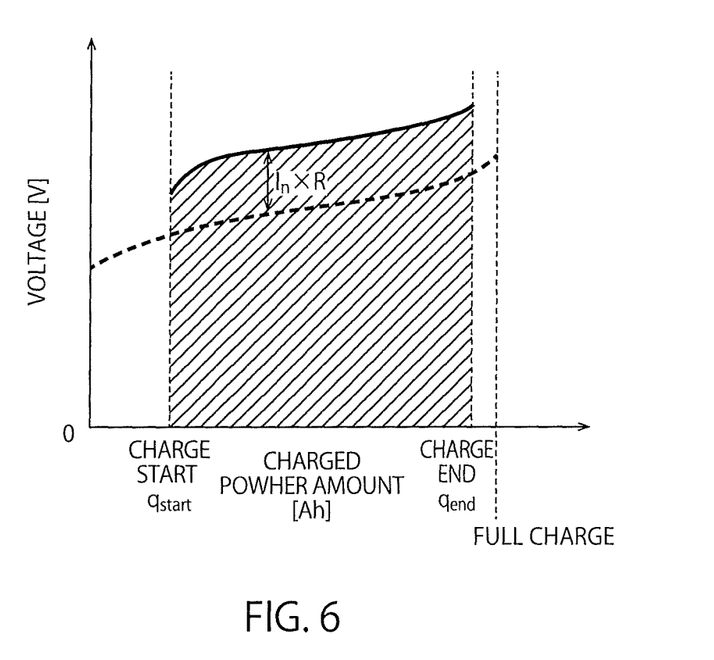
FIG. 6 is a diagram explaining calculation of charged power amount.

Based on the state estimated by the state estimator, the power estimator 24 estimates charged power amount. Specifically, based on the estimated charge amount-OCV curve and the like, the charged power amount is estimated. FIG. 6 is a diagram explaining calculation of charged power amount. The dotted line is the charge amount-OCV curve illustrated in FIG. 5.

The power estimator 24 converts the charge amount-OCV curve into a charge amount-voltage curve (first graph) that represents a relationship between a charge amount and voltage of the storage battery 1. The voltage of the storage battery 1 is obtained by adding an integral of an electric current value "$I_n$" at the charge amount of "$q_n$" over the internal resistance "$R$" to the open circuit voltage "$E_n$". When the charge amount-voltage curve is expressed as a function "$V_n(q_n)$" of "$q_n$," the charge amount-voltage curve is expressed by the following expression.

[Expression 4]

$$V_n(q_n) = I_n(q_n) \times R + E_n(q_n) \quad (4)$$

The electric current value "$I_n$" can be calculated from correspondence between the electric current value "$I_t$" at time "$t$" indicated in the measurement data and the charge amount "$q_t$" calculated during calculation of the internal state parameters. As the internal resistance "$R$," a value estimated by the state estimator 23 may be used. Consequently, the charge amount-OCV curve indicated by the dotted line is converted into the charge amount-voltage curve indicated by the solid line.

The power estimator 24 calculates "$q_{start}$" (a charge amount of the storage battery 1 at the start of charging) and "$q_{end}$" (a charge amount of the storage battery 1 at the end of charging). The charge amount "$q_{start}$" can be calculated by subtracting the charge amount "$q_{n0}$" from calculated charge amount, the calculated charge amount being calculated by substituting the voltage and current at the charging start time indicated in the measurement data; and the calculated parameter set into Expression (1). Also, the charge amount "$q_{end}$" can be calculated by adding the sum total of electric currents during the charging to the charge amount "$q_{start}$", the electric currents being indicated in the measurement data.

As shown in FIG. 6, the charged power amount is given by an area defined by the charge amount-OCV curve in the interval from the charge amount "$q_{start}$" to the charge amount "$q_{end}$" and the abscissa. Therefore, the charged power amount is calculated by the following expression.

[Expression 5]

$$\text{Charged power amount} = \int_{q_{end}}^{q_{end}} V_n(q_n) dq_n \quad (5)$$

Based on the charged power amount estimated by the power estimator 24 and AC power amount in the same charging period as the charged power amount the determiner 25 determines the validity of the state estimated by the state estimator. More specifically, the determiner 25 compares the charged power amount with the input power amount calculated from the AC power amount and thereby determines the validity of the estimated state.

The input power amount is power amount assumed to have been used for charging by being inputted to the storage battery 1. Incidentally, when only charging is done, the input power amount means only the power amount inputted to the storage battery 1. When both charging and discharging are done, the input power amount means the sum of the power amount inputted to the storage battery 1 and outputted power amount (negative input power amount). When only discharging is done, the AC power amount and input power amount take negative values.

The determiner 25 acquires measurement data on the measured alternating current from the alternating current measuring apparatus 4. When the AC power amount during the charging period is indicated in the measurement data, the determiner 25 can use the AC power amount indicated in the measurement data, as it is. When time series data of AC power during the charging period is indicated in the measurement data, the determiner 25 calculates the AC power amount by adding the power indicated in the time series data. This is also true when time series data of the alternating current and AC power during the charging period are indicated in the measurement data.

The determiner 25 calculates the input power amount from the AC power amount. Due to conversion efficiency of the converter 3, the input power amount does not become equal to the AC power amount. Also, all the direct current resulting from conversion performed by the converter 3 may not be used to charge the storage battery 1, and it is necessary to take into consideration the ratio (usage ratio) at which the direct current resulting from the conversion is used to charge the storage battery 1. Thus, the input power amount is given by the following expression using the conversion efficiency and usage ratio.

[Expression 6]

$$\text{Input power amount} = \text{AC power amount} \times \text{conversion efficiency} \times \text{usage ratio} \quad (6)$$

The determiner 25 acquires the estimated charged power amount from the power estimator 24. Then, the determiner 25 compares the charged power amount with the input power amount, and determines validity based on a comparison result. For example, it is determined that the state is invalid when a condition is met, such as the charged power amount being higher than the input power amount; a difference calculated by subtracting the charged power amount from the input power amount being larger than a threshold; and a ratio of the charged power amount to the input power amount being smaller than a threshold. The condition used to determine the validity may be set as appropriate.

Also, the determiner 25 may determine to do recharging and give instructions to the charge controller 21. For example, when the state cannot be determined to be valid, the determiner 25 may determine to do recharging and give instructions to the charge controller 21. A determination criterion for recharging may also be set as appropriate.

Also, when the number of recharging sessions exceeds an upper limit, the determiner 25 may determine that a malfunction has occurred. Furthermore, the determiner 25 may determine a source of the malfunction. For example, by establishing a normal range of charged power amount beforehand according to the length of a charging period, if charged power amount in all the charging sessions calculated so far fall within this range, it may be determined that a component other than the storage battery 1—for example, the converter—is malfunctioning. Also, if the ratio of the charging sessions in which charged power amount falls outside the range exceeds an upper limit, it may be determined that the storage battery 1 is malfunctioning.

The output device 26 outputs estimation results of the battery state estimating apparatus and results of determining the validity of the estimation results. Also, process results of other components may be outputted. For example, information such as the charged power amount, input power amount, estimated state, and charging period may be outputted by being acquired from each component.

The output method of the output device 26 is not specially limited. The output may be in the form of a file, a mail, an image, sound, light, or the like. For example, with the battery state estimating apparatus 2 being connected to a display, a speaker, and the like via the output device 26, the process results of components may be outputted to another apparatus. The method and contents of output may be determined in advance.

The storage 27 stores data used for processes of the battery state estimating apparatus 2. For example, data such as relational expressions needed for calculation of internal state parameters, battery characteristics, and the like may be stored. Also, process results and the like may be recorded.

As described above, according to the present embodiment, when the state of the storage battery 1 is estimated, the validity of the estimation is determined. This allows the validity of the estimation to be recognized. Also, since performing of the estimation is made again based on the determination, accuracy of the estimation can be improved. Also, using a determination criterion such as the number of times of performing of the estimation, an inspection request can be made, allowing integrity of the system to be guaranteed.

Also, according to the present embodiment, based on the parameters used to calculate the state estimation results of the battery state estimating apparatus 2 or other parameters derived together with the above-mentioned parameters, the charged power amount to be used for validity determination is estimated. Therefore, credibility of the determination is improved compared with when the estimated state and charged power amount have a relation with each other and validity is determined based on values calculated independently of the state estimation.

Incidentally, as described above, when charge curve analysis is used, the term "charge" may be interchanged with "discharge" or "charge/discharge" in the above description. For example, the charge controller may be interchanged with charge/discharge controller configured to control charging or discharging and instruct charging or discharging to be done. The charging period in which charging is done may be a charging/discharging period in which charging/discharging is done. Also, the charged power amount in the charging period may be interchanged with the power amount (first power amount) charged/discharged by the storage battery 1 within the charging/discharging period. Also, the input power amount in the charging period may be interchanged with the power amount (second power amount) inputted/outputted to/from the storage battery 1 within the discharging period. This is also true for other phrases related to charging.

Incidentally, the system configuration described above is exemplary, and the present invention is not limited to the configuration described above. For example, part of the components of the battery state estimating apparatus 2 may be separated from the battery state estimating apparatus 2 as external devices by being configured to be able to transmit and receive necessary data via communications or electric signals. For example, whereas the battery state estimating apparatus 2 makes both state estimations and validity determinations in the above description, an apparatus that makes state estimations and an apparatus that makes validity determinations may be provided separately.

Also, each process in the embodiment described above may be implemented by a dedicated circuit or implemented using software (program). When software (program) is used, the embodiment described above can be implemented by using, for example, a general-purpose computer device as basic hardware and causing a processor such as a central processing unit (CPU) mounted in the computer device to execute the program.

Figure 7:
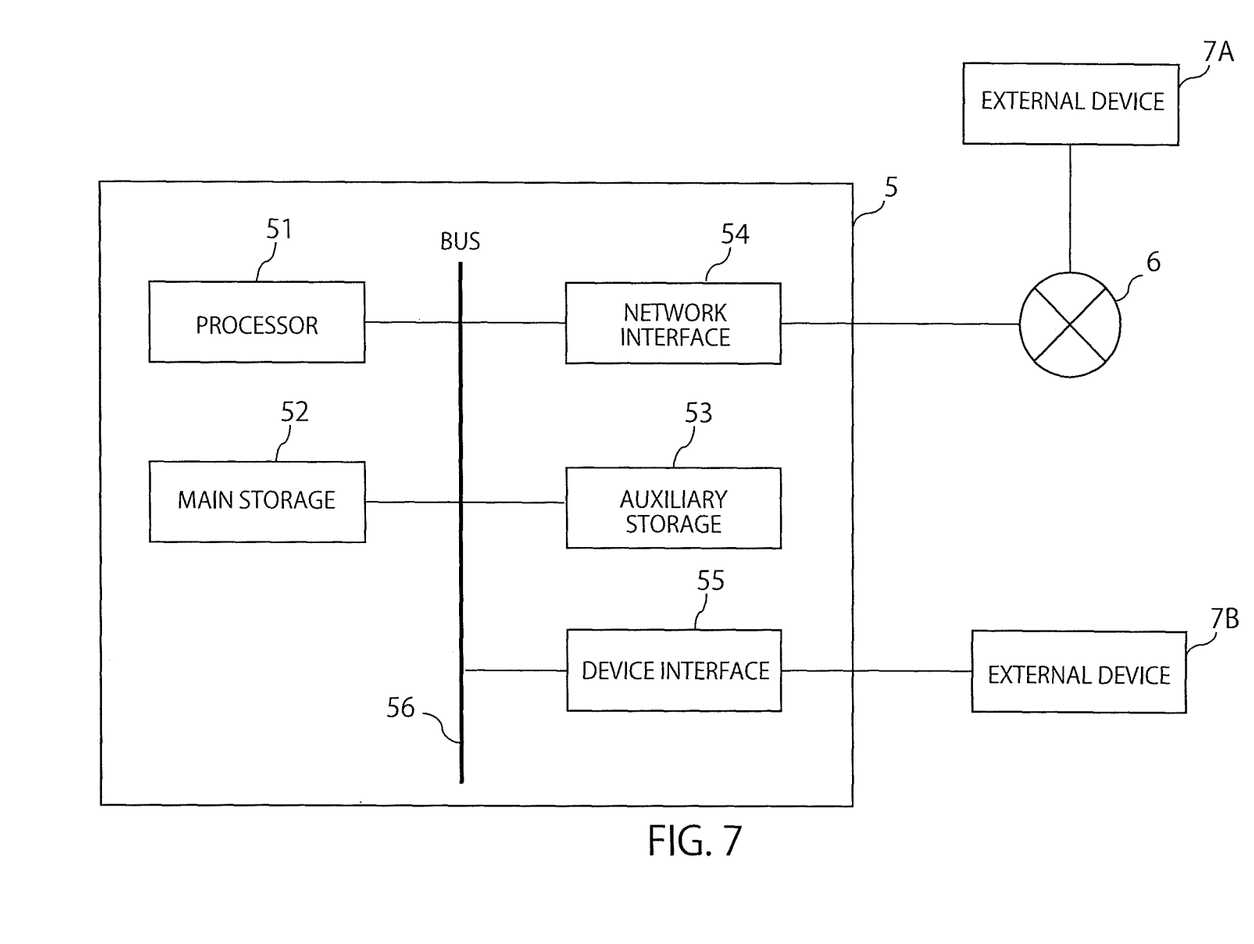
FIG. 7 is a block diagram illustrating an example of a hardware configuration according to an embodiment of the present invention.

FIG. 7 is a block diagram illustrating an example of a hardware configuration according to an embodiment of the present invention. The battery state estimating apparatus 2 can be implemented as a computer device 5 including a processor 51, a main storage 52, an auxiliary storage 53, a network interface 54, and a device interface 55, which are interconnected via a bus 56.

The processor 51 reads a program out of the auxiliary storage 53, loads the program into the main storage 52, and executes the program. Consequently, respective functions of the components of the battery state estimating apparatus 2 can be implemented.

The processor 51 is an electronic circuit including a control unit and processing unit of the computer. The processor 51 can be, for example, a general-purpose processor, a central processing unit (CPU), a microprocessor, a digital signal processor (DSP), a controller, a microcontroller, a state machine, an application specific integrated circuit, a field programmable gate array (FPGA), a programmable logic circuit (PLD), or a combination thereof.

The battery state estimating apparatus 2 according to the present embodiment may be implemented by pre-installing programs to be executed by respective devices on the computer device 5 or installing programs on the computer device 5 as appropriate, the programs being stored in a storage medium such as a CD-ROM or distributed via a network.

The main storage 52 temporarily stores instructions to be executed by the processor 51, various types of data, and the like, and may be a volatile memory such as a DRAM or a non-volatile memory such as an MRAM. The auxiliary storage 53 permanently stores programs, data, and the like and is, for example, a flash memory. The storage 27 may be implemented by the main storage 52 or auxiliary storage 53.

The network interface 54 is used to connect to a communications network 6 by wire or by radio. The network interface 54 allows the computer device 5 to be connected to an external device 7A via the communications network 6.

The device interface 55 is an interface such as a USB used to directly connect to an external device 7B. That is, the computer device 5 can be connected to external devices 7 either directly or via a network. The external devices 7 (7A and 7B) may be any of devices outside the battery state estimating apparatus 2, devices inside the battery state estimating apparatus 2, external storage media, and storage devices. Incidentally, the storage 27 may be an external device.

Incidentally, the external devices 7 may be input devices or output devices. The input devices include devices such as a keyboard, a mouse, and a touch panel and provide information inputted via these devices to the computer device 5. Signals from the input devices are outputted to the processor 51.

The computer device 5 may be built from dedicated hardware such as a semiconductor integrated circuit on which the processor 51 and the like are mounted. The dedicated hardware may be built in combination with a storage device such as an RAM or ROM. The computer device 5 may be incorporated into the storage battery 1.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A battery state estimating apparatus, comprising:
a measurer configured to measure measurement data including a voltage and a current of a battery in a charging/discharging period;
a state estimator configured to estimate a state of the battery based on the measurement data;
a power estimator configured to estimate a first power amount charged/discharged by the battery within the charging/discharging period, based on the state; and
a determiner configured to compare the first power amount with a second power amount inputted/outputted to/from the battery within the charging/discharging period, the second power amount being calculated based on an alternating current inputted/outputted to/from a power storage system, and thereby determine validity of the state.

2. The battery state estimating apparatus according to claim 1, wherein:
the state estimator calculates one or more parameters that represent the state based on first the measurement data that represents at least the voltage and the current of the battery within the charging/discharging period; and
the state estimator estimates the first power amount based on any of the parameters.

3. The battery state estimating apparatus according to claim 2, wherein:
the state estimator calculates a first graph that represents a relationship between a charge amount and the voltage of the battery, based on any of the parameters; and
the power estimator calculates the first power amount based on the first graph.

4. The battery state estimating apparatus according to claim 3, wherein:
the state estimator calculates an initial charge amount and a mass of each of positive electrode and negative electrode of the battery based on the first measurement data;
the state estimator calculates a second graph that represents a relationship between the charge amount and an open circuit voltage of the battery, based on the calculated initial charge amount and the mass of each of the positive electrode and negative electrode of the battery; and
the state estimator calculates the first graph based on the second graph.

5. The battery state estimating apparatus according to claim 1, wherein
the determiner calculates the second power amount based on second measurement data on an alternating current inputted/outputted to/from a converter that converts an alternating current to a direct current.

6. The battery state estimating apparatus according to claim 5, wherein the determiner determines a malfunction of the battery or the converter based on a determination result of the validity.

7. A battery state estimating method, comprising:
measuring measurement data including a voltage and a current of a battery in a charging/discharging period;
estimating a state of a battery based on the measurement data;
estimating a first power amount charged/discharged by the battery within the charging/discharging period, based on the state; and
comparing the first power amount with a second power amount inputted/outputted to/from the battery within the charging/discharging period, the second power amount being calculated based on an alternating current inputted/outputted to/from a power storage system, and thereby determining validity of the state.

8. A non-transitory computer readable medium having a program for causing a computer to execute:
measuring measurement data including a voltage and a current of a battery in a charging/discharging period;
estimating a state of a battery based on the measurement data;
estimating a first power amount charged/discharged by the battery within the charging/discharging period, based on the state; and
comparing the first power amount with a second power amount inputted/outputted to/from the battery within the charging/discharging period, the second power amount being calculated based on an alternating current inputted/outputted to/from a power storage system, and thereby determining validity of the state.

9. A control circuit comprising:
a measurer configured to measure measurement data including a voltage and a current of a battery in a charging/discharging period;
a state estimator configured to estimate a state of a battery based on the measurement data;
a power estimator configured to estimate a first power amount charged/discharged by the battery within the charging/discharging period, based on the state; and
a determiner configured to compare the first power amount with a second power amount inputted/outputted to/from the battery within the charging/discharging period, the second power amount being calculated based on an alternating current inputted/outputted to/from a power storage system, and thereby determine validity of the state.

10. A power storage system comprising:
a battery;
a battery state estimating apparatus configured to estimate a state of a battery;
a converter configured to convert a direct current to an alternating current; and
an alternating current measuring apparatus configured to measure an alternating current inputted/outputted to/from the converter, wherein
the battery state estimating apparatus includes:
a state estimator configured to estimate a state of the battery,
a power estimator configured to estimate first power amount charged/discharged by the battery within a charging/discharging period, based on the state, and
a determiner configured to compare the first power amount with second power amount of the alternating current inputted/outputted to/from the converter within the charging/discharging period and thereby determine validity of the state.

* * * * *